US009589493B2

(12) United States Patent
Gai et al.

(10) Patent No.: US 9,589,493 B2
(45) Date of Patent: Mar. 7, 2017

(54) ORGANIC ELECTROLUMINESCENT DISPLAY DEVICE, DRIVING METHOD THEREOF AND DISPLAY DEVICE

(71) Applicant: BOE TECHNOLOGY GROUP CO., LTD., Beijing (CN)

(72) Inventors: Cuili Gai, Beijing (CN); Danna Song, Beijing (CN); Zhongyuan Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 70 days.

(21) Appl. No.: 14/429,820

(22) PCT Filed: Jun. 23, 2014

(86) PCT No.: PCT/CN2014/080533
§ 371 (c)(1),
(2) Date: Mar. 20, 2015

(87) PCT Pub. No.: WO2015/106540
PCT Pub. Date: Jul. 23, 2015

(65) Prior Publication Data
US 2016/0012761 A1    Jan. 14, 2016

(30) Foreign Application Priority Data

Jan. 17, 2014   (CN) .......................... 2014 1 0023236

(51) Int. Cl.
*G09G 3/20* (2006.01)
*G09G 3/32* (2016.01)
*H01L 27/32* (2006.01)

(52) U.S. Cl.
CPC ......... *G09G 3/2003* (2013.01); *G09G 3/3208* (2013.01); *H01L 27/3213* (2013.01);
(Continued)

(58) Field of Classification Search
CPC ......... G09G 2300/0452; G09G 3/3208; G09G 3/3607; G09G 2330/021; G09G 3/2003;
(Continued)

(56) References Cited

U.S. PATENT DOCUMENTS

2004/0201558 A1   10/2004   Arnold et al.
2004/0251820 A1   12/2004   Cok et al.
(Continued)

FOREIGN PATENT DOCUMENTS

| CN | 1841469 A | 10/2006 |
|---|---|---|
| CN | 101336443 A | 12/2008 |

(Continued)

OTHER PUBLICATIONS

Oct. 22, 2014—(CN) International Search Report for PCT/CN2014/080533.
(Continued)

*Primary Examiner* — Hong Zhou
(74) *Attorney, Agent, or Firm* — Banner & Witcoff, Ltd.

(57) ABSTRACT

An organic electroluminescent display device, a driving method thereof and a display device are provided. The organic electroluminescent display device comprises: a plurality of pixel units arranged in matrix, each of the pixel units comprising a plurality of sub-pixel units for displaying different colors, and in each row of the pixel units, two adjacent pixel units constituting a pixel unit group; and a sub-pixel unit for displaying white between the two adjacent pixel units in each pixel unit group. The area occupied by the sub-pixel unit for displaying white is greater than that occupied by any one sub-pixel unit in the pixel unit. The sub-pixel unit for displaying white is configured such that the luminance of emitted light thereof replaces the luminance of light emitted by one pixel unit of two adjacent pixel units in a frame according to a preset condition.

11 Claims, 3 Drawing Sheets

(52) U.S. Cl.
CPC . *H01L 27/3216* (2013.01); *G09G 2300/0452* (2013.01); *G09G 2360/16* (2013.01)

(58) Field of Classification Search
CPC ............... G09G 3/3225; G09G 5/02; G09G 2320/0242; G09G 3/3413; G09G 2320/043; G09G 2320/0626; G09G 3/2074; G09G 3/3406; G09G 5/026; G09G 2300/0439; G09G 2300/443; G09G 2330/10; G09G 2320/0233; G09G 5/10; G09G 2360/16; H01L 27/3213; H01L 27/3216
USPC ...................................... 345/76–83, 204–694
See application file for complete search history.

(56) References Cited

U.S. PATENT DOCUMENTS

| | | | | |
|---|---|---|---|---|
| 2005/0179675 A1* | 8/2005 | Hekstra | ................ | G09G 3/2003 345/204 |
| 2006/0221092 A1* | 10/2006 | Noguchi | ............. | G09G 3/3233 345/589 |
| 2007/0075627 A1* | 4/2007 | Kimura | .............. | H01L 27/3213 313/503 |
| 2007/0176862 A1* | 8/2007 | Kurt | ..................... | G09G 3/2092 345/82 |
| 2009/0051638 A1* | 2/2009 | Horiuchi | .............. | G09G 3/2003 345/88 |
| 2009/0322802 A1* | 12/2009 | Noguchi | ............. | G09G 3/2003 345/694 |
| 2010/0141693 A1* | 6/2010 | Lee | ...................... | G09G 3/3216 345/694 |
| 2012/0206512 A1* | 8/2012 | Kim | ................. | G02F 1/133514 345/691 |
| 2013/0120472 A1* | 5/2013 | Byun | ...................... | G09G 5/02 345/690 |

FOREIGN PATENT DOCUMENTS

| | | |
|---|---|---|
| CN | 102623462 A | 8/2012 |
| CN | 103779388 A | 5/2014 |
| CN | 203674216 U | 6/2014 |

OTHER PUBLICATIONS

Oct. 22, 2014—(CN) Written Opinion for PCT/CN2014/080533—Eng Tran.

* cited by examiner

ORGANIC ELECTROLUMINESCENT DISPLAY DEVICE, DRIVING METHOD THEREOF AND DISPLAY DEVICE

The application is a U.S. National Phase Entry of International Application No. PCT/CN2014/080533 filed on Jun. 23, 2014, designating the United States of America and claiming priority to Chinese Patent Application No. 201410023236.7 filed on Jan. 17, 2014. The present application claims priority to and the benefit of the above-identified applications and the above-identified applications are incorporated by reference herein in their entirety.

TECHNICAL FIELD

Embodiments of the present invention relate to an organic electroluminescent display device, a driving method thereof and a display device.

BACKGROUND

At present, compared with liquid crystal display devices (LCDs), organic electroluminescent display devices (OLEDs) have characteristics such as fast response, wide color gamut, ultrathin thickness and capability of flexibility, and therefore gradually become the main stream in display field.

The structure of an OLED display device mainly comprises: a base substrate, an organic electroluminescent pixel array fabricated on the base substrate, wherein each organic electroluminescent pixel array comprises an anode and a cathode disposed oppositely and a luminescent layer between the anode and the cathode. The OLED display device implements light emission by exciting the organic material in the luminescent layer to emit light through the recombination of electrons in the cathode and holes in the anode in the luminescent layer.

At present, there are five methods for OLED display devices to implement full color display, namely red, green and blue pixels side-by-side pixelation (RGB-SBS), color conversion method, color filter method, resonant cavity color tuning method and multi-layer stack method. The color filter method uses the full color display principle of liquid crystal displays, wherein white light is emitted by means of an OLED and then filtered to obtain three primary colors by the color filter. However, in this type of display structure, most light energy of the white light is absorbed by the color filter, resulting in a low transmittance. Therefore, it is difficult to display white pictures with high luminance, which causes the OLED display device can not display images with high contrast and further increases power consumption of the OLED display device.

Therefore, in order to improve luminance and reduce power consumption of an OLED display device, an OLED display device with RGBW pixel structure has been manufactured as shown in FIG. 1. In the OLED display device of such a structure, a pixel unit 1 comprises sub-pixel units 01 displaying RGBW four colors. Since the light transmittance in the sub-pixel units 01 for displaying white is much higher than that in the sub-pixel units 01 for displaying red, green or blue, gray luminance of each pixel unit is determined by the sub-pixel unit 01 for displaying white in this pixel unit. Gray luminance of a pixel unit refers to the luminance of a pixel unit during the luminance transitions from white (black) to black (white). Compared with OLED display devices with RGB pixel structure, OLED display devices with RGBW pixel structure can enhance luminance of OLED display devices. However, in OLED display devices of RGBW pixel structure, since in operation, the sub-pixel units displaying white is constantly emitting light in comparison to the sub-pixel units displaying red, green or blue, the lifetime of the sub-pixel units displaying white will be reduced, thereby reducing the lifetime of the entire OLED display device.

SUMMARY

Embodiments of the present invention provide an organic electroluminescent display device, a driving method thereof and a display device to extend the lifetime of the OLED display device while ensuring the luminance of the OLED display device.

At least one embodiment of the present invention provides an organic electroluminescent display device comprising: a plurality of pixel units arranged in a matrix, wherein each of the pixel units comprises a plurality of sub-pixel units for displaying different colors, and in each row of the pixel units, two adjacent pixel units constitute a pixel unit group; and a sub-pixel unit for displaying white between the two adjacent pixel units in each pixel unit group. An area occupied by the sub-pixel unit for displaying white is greater than an area occupied by any one sub-pixel unit in the pixel units. The sub-pixel unit for displaying white is configured such that luminance of emitted light thereof replaces luminance of light emitted by one pixel unit of the two adjacent pixel units in a frame according to a preset condition.

For example, one embodiment of the present invention provides an organic electroluminescent display device, wherein the luminance of light emitted by the sub-pixel unit for displaying white replaces the luminance of light emitted by one pixel unit of the two adjacent pixel units alternatively in odd numbered frames and even numbered frames.

For example, one embodiment of the present invention provides an organic electroluminescent display device, wherein the luminance of light emitted by the sub-pixel unit for displaying white replaces the luminance of light emitted by a pixel unit with higher luminance of the two adjacent pixel units in a frame.

For example, one embodiment of the present invention provides an organic electroluminescent display device, wherein same areas are occupied by respective sub-pixel units in each pixel unit; and the area occupied by the sub-pixel unit for displaying white is equal to the sum of areas occupied by any two sub-pixel units in the pixel unit.

For example, one embodiment of the present invention provides an organic electroluminescent display device, wherein the plurality of sub-pixel units in each of the pixel units is arranged in a row direction of the pixel unit.

For example, one embodiment of the present invention provides an organic electroluminescent display device, wherein each of the pixel units comprises a sub-pixel unit for displaying red, a sub-pixel unit for displaying green and a sub-pixel unit for displaying blue.

For example, one embodiment of the present invention provides an organic electroluminescent display device, wherein each sub-pixel unit in the pixel unit directly emit monochromatic light corresponding to a color of the sub-pixel unit after being electrically excited; or light emitted by each sub-pixel unit in the pixel unit after being electrically excited forms monochromatic light corresponding to the color of the sub-pixel unit after passing a color filter.

Another embodiment of the present invention provides a display device comprising any one of the above-mentioned organic electroluminescent display devices provided in embodiments of the present invention.

Another embodiment of the present invention provides a driving method of organic electroluminescent display device, wherein the organic electroluminescent display device comprises: a plurality of pixel units arranged in matrix, wherein each of the pixel units comprises a plurality of sub-pixel units for displaying different colors, and in each row of the pixel units, two adjacent pixel units constitute a pixel unit group; and further comprises a sub-pixel unit for displaying white between two adjacent pixel units in each pixel unit group, wherein an area occupied by the sub-pixel unit for displaying white is greater than that occupied by any one sub-pixel unit in the pixel units. The driving method comprises: replacing luminance of light emitted by one pixel unit of the two adjacent pixel units by luminance of light emitted with the sub-pixel unit for displaying white alternatively in odd numbered and even numbered frames.

Another embodiment of the present invention provides a driving method of organic electroluminescent display device, wherein the organic electroluminescent display device comprises: a plurality of pixel units arranged in matrix, wherein each of the pixel units comprises a plurality of sub-pixel units for displaying different colors, and in each row of the pixel units, two adjacent pixel units constitute a pixel unit group; and further comprises a sub-pixel unit for displaying white between two adjacent pixel units in each pixel unit group, wherein an area occupied by the sub-pixel unit for displaying white is greater than that occupied by any one sub-pixel unit in the pixel units. The driving method comprises: replacing luminance of light emitted by a pixel unit with higher luminance of the two adjacent pixel units with luminance of light emitted by the sub-pixel unit for displaying white in a frame.

BRIEF DESCRIPTION OF THE DRAWINGS

In order to explain the technical solution of embodiments of the present invention more clearly, accompanying drawings of the embodiments will be introduced briefly below. Obviously, the accompanying drawings in the following description only relate to some embodiments of the present invention and thus are not limitative of the present invention.

DETAILED DESCRIPTION

Figure 1:
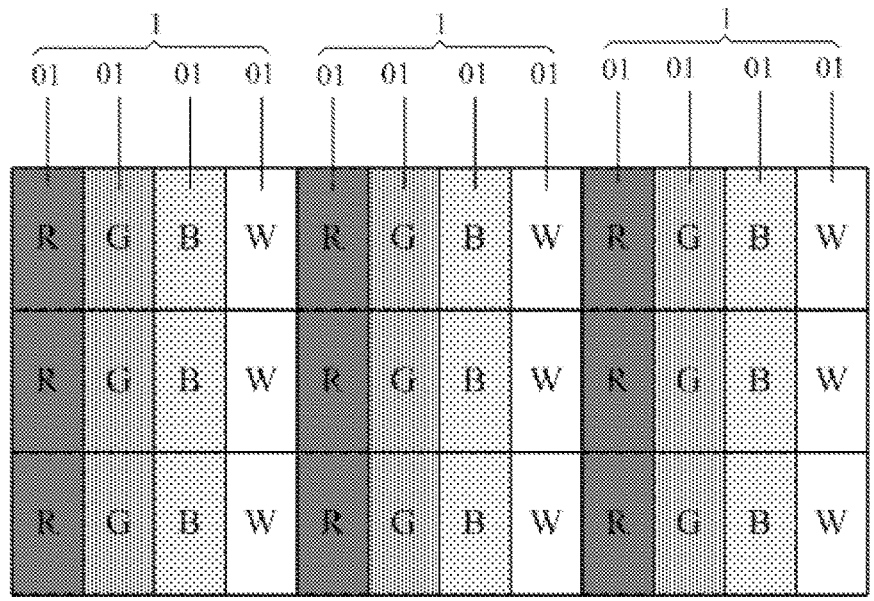
FIG. 1 is a structural schematic view of an organic electroluminescent display device.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Shapes and sizes in the drawings do not reflect real scale of the organic electroluminescent display device and only serve to illustrate contents of the present invention.

Figure 2:
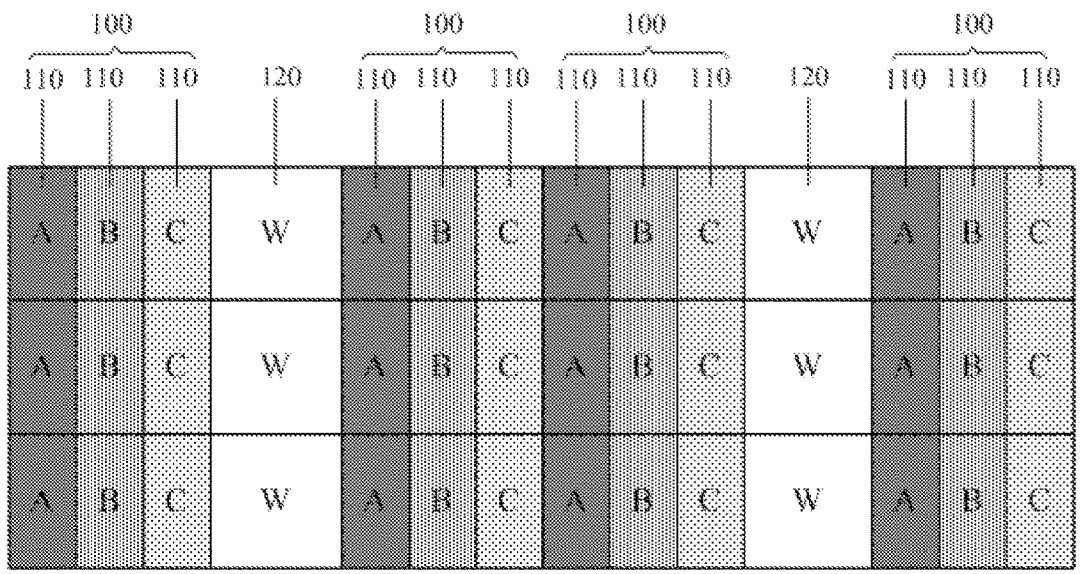
FIG. 2 is a structural schematic view of an organic electroluminescent display device provided in one embodiment of the present invention.
Figure 3:
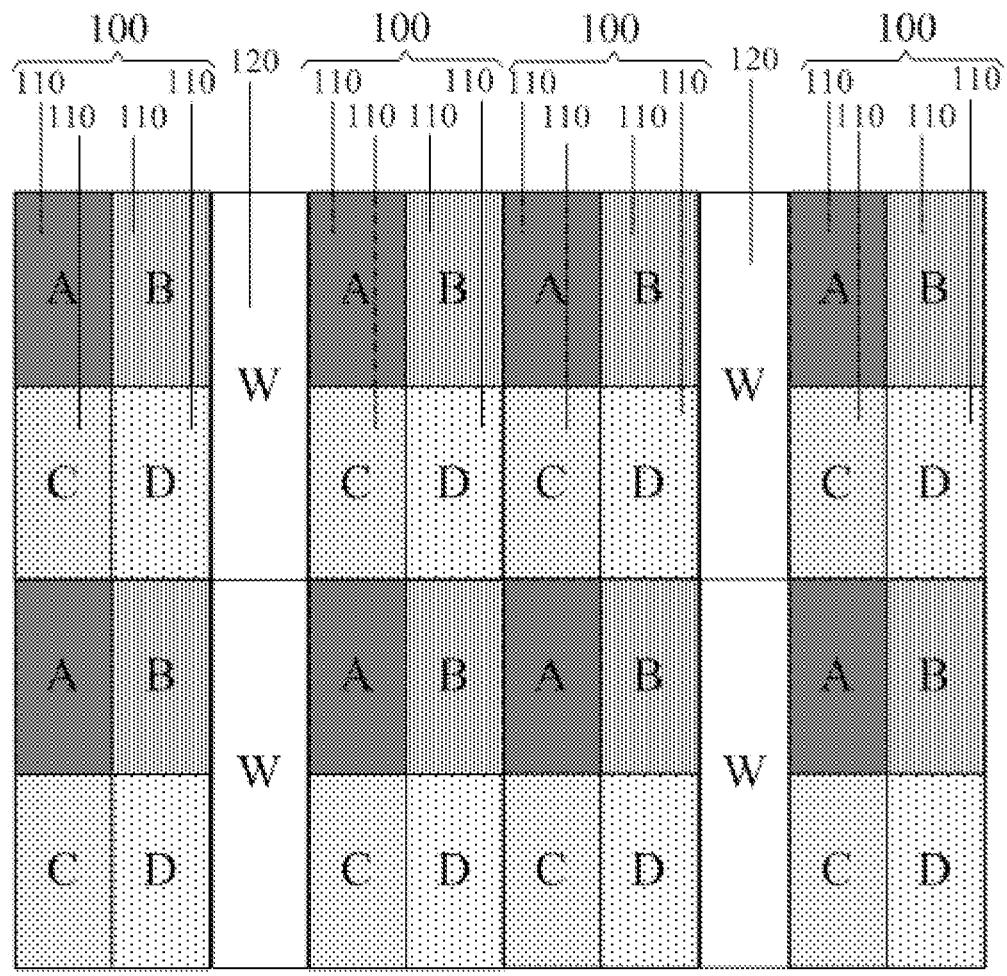
FIG. 3 is a structural schematic view of an organic electroluminescent display device provided in another embodiment of the present invention.

Embodiments of the present invention provide an organic electroluminescent display device as shown in FIGS. 2 and 3. The organic electroluminescent display device comprises a plurality of pixel units 100 arranged in matrix, wherein each of the pixel units 100 comprises a plurality of sub-pixel units 110 for displaying different colors. In each row of the pixel units 100, two adjacent pixel units 100 constitute a pixel unit group. The organic electroluminescent display device further comprises a sub-pixel unit 120 for displaying white between two adjacent pixel units in each pixel unit group. The sub-pixel unit 120 for displaying white occupies an area greater than an area occupied by any one sub-pixel unit 110 in the pixel units; and luminance of light emitted by the sub-pixel unit 120 displaying white replaces luminance of light emitted by one pixel unit 100 in the two adjacent pixel units in a frame according a preset condition.

In the above-mentioned organic electroluminescent display device provided in embodiments of the present invention, the sub-pixel unit for displaying white is located between two adjacent pixel units in each pixel unit group and occupies an area greater than an area occupied by any one sub-pixel unit in the pixel units, and thus the arrangement of sub-pixel units in the embodiments can increase the aperture ratio of individual sub-pixel unit for displaying white, thereby reducing the driving current required by the sub-pixel unit for displaying white, and in turn reducing the power consumption of the sub-pixel unit for displaying white, and finally increasing the overall lifetime of the organic electroluminescent display device. Furthermore, in the organic electroluminescent display device, the luminance of light emitted by the sub-pixel unit for displaying white replaces the luminance of light emitted by one of the two adjacent pixel units in a frame according to a preset condition, therefore, the overall display luminance of the organic electroluminescent display device can be ensured while displaying.

For example, the structure of the organic electroluminescent display device in FIG. 2 is described with respect to a pixel unit 100 comprising three sub-pixel units 110 for displaying different colors as an example. In FIG. 2, A, B and C represent three different colors (for example, RGB) and W represents white. The structure of the organic electroluminescent display device in FIG. 3 is described with respect to a pixel unit 100 comprising four sub-pixel units 110 for displaying different colors as an example. In FIG. 3, A, B, B and D represent four different colors (for example, CMYK) and W represents white. Of course, in the organic electroluminescent display device provided in embodiments of the present invention, the pixel unit can further comprises more sub-pixel units for displaying different colors and arrangement thereof can be of "田" like or along the row direction of the pixel unit, which is not limited herein.

In the above-mentioned organic electroluminescent display device provided in embodiments of the present invention, the luminance of light emitted by the sub-pixel unit displaying white replacing the luminance of light emitted by one pixel unit comprises for example the following cases. As one sub-pixel unit in the pixel unit, the sub-pixel unit for displaying white converts an input original RGB signal into a RGBW signal by a prior art RGBW algorithm and inputs the RGBW signal into respective sub-pixel units for display. As can be known from comparison, gray scale values of RGB signal in the converted RGBW signal decrease with respect to the original RGB signal.

For example, in one specific example of the organic electroluminescent display device, the luminance of light emitted by a sub-pixel unit displaying white can replace the luminance of light emitted by one pixel unit in two adjacent pixel units alternatively in odd numbered and even numbered frames.

That the luminance of light emitted by a sub-pixel unit displaying white between two adjacent pixel units in each pixel unit group can replace the luminance of light emitted by one pixel unit in the two adjacent pixel units alternatively in odd numbered and even numbered frames will be explained below with respect to the structure of the organic electroluminescent display device shown in FIG. 2 as an example.

Figure 4A:
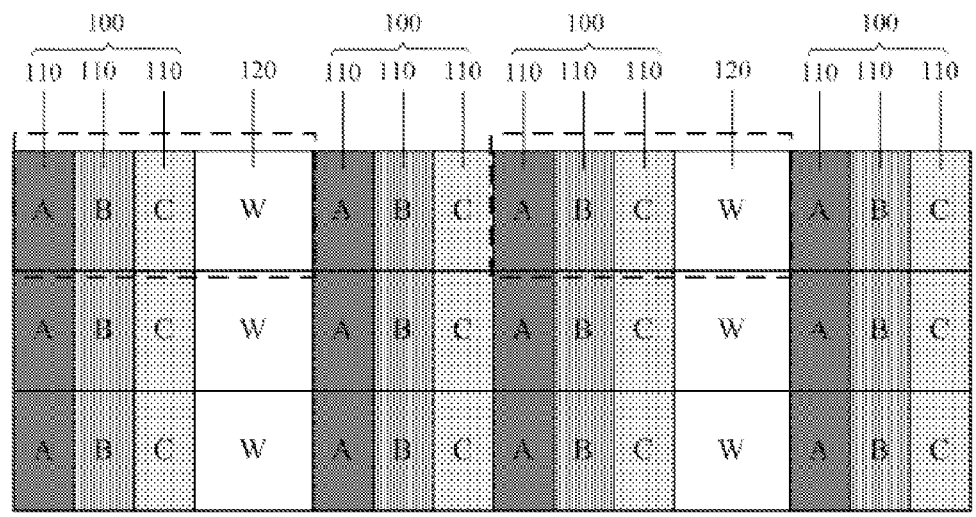
FIGS. 4a and 4b are schematic diagrams of the luminance of light emitted by a sub-pixel unit for displaying white when it replaces one of two adjacent pixel units in the organic electroluminescent display device shown in FIG. 2.
Figure 4B:
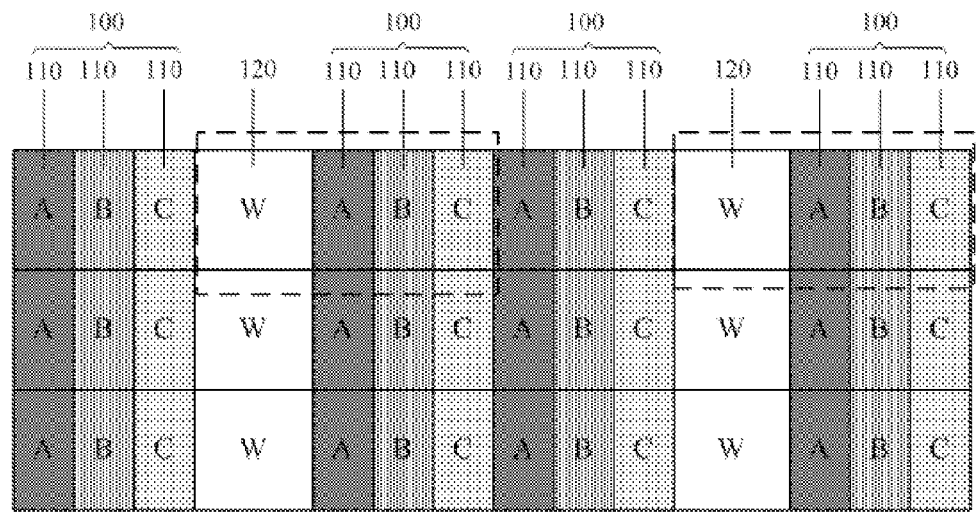

For example, in one specific example, in an odd numbered frame, as shown in FIG. 4a by broken line boxes, the luminance of light emitted by the sub-pixel unit 120 displaying white replaces the luminance of light emitted by the odd numbered pixel unit 100 of the two adjacent pixel units 100; and in an even numbered frame, as shown in FIG. 4b by the broken line boxes, the luminance of light emitted by the sub-pixel unit 120 displaying white replaces the luminance of light emitted by the even numbered pixel unit 100 of the two adjacent pixel units 100.

Alternatively, in one specific example, in an odd numbered frame, as shown in FIG. 4b by broken line boxes, the luminance of light emitted by the sub-pixel unit 120 displaying white replaces the luminance of light emitted by the even numbered pixel unit 100 of the two adjacent pixel units 100; and in an even numbered frame, as shown in FIG. 4a by the broken line boxes, the luminance of light emitted by the sub-pixel unit 120 displaying white replaces the luminance of light emitted by the odd numbered pixel unit 100 of the two adjacent pixel units 100.

For example, in one specific example of the organic electroluminescent display device, the luminance of light emitted by the sub-pixel unit displaying white between two adjacent pixel units of each pixel unit group can replace the luminance of light emitted by a pixel unit with higher luminance of the two adjacent pixel units in a frame.

For example, in one specific example of the organic electroluminescent display device, before displaying a frame of picture, it is required to firstly determine which one of two adjacent pixel units of each pixel unit group has higher luminance, and then while displaying a frame of picture, the luminance of light emitted by the sub-pixel unit displaying white between the two adjacent pixel units in the pixel unit group replaces the luminance of light emitted by a pixel unit with higher luminance of the two adjacent pixel units in a frame.

For example, in an organic electroluminescent display device provided in one embodiment of the present invention, same areas are occupied by respective sub-pixel units in each pixel unit. Therefore, the larger area the sub-pixel unit for displaying white occupies, the larger the aperture ratio of the sub-pixel unit for displaying white is, the smaller driving current the sub-pixel unit for displaying white requires, and thus the lower power consumption the sub-pixel unit for displaying white has, and the longer lifetime the sub-pixel unit for displaying white has. However, the sub-pixel unit for displaying white occupying too large area also influence areas occupied by respective pixel units, therefore it is possible to set the area occupied by the sub-pixel unit for displaying white according to practical requirements.

For example, in the organic electroluminescent display device provided in one embodiment of the present invention, as shown in FIGS. 2 and 3, the area occupied by the sub-pixel unit 120 for displaying white is equal to the sum of areas occupied by any two sub-pixel units 110 in the pixel unit 100.

For example, in one specific example of the organic electroluminescent display device, as shown in FIG. 2, the plurality of sub-pixel units 110 in each pixel unit 100 can be arranged in the row direction of the pixel unit. Of course, the plurality of sub-pixel units 110 in each pixel unit 100 can also be arranged in other modes that can realize the technical solutions of the present invention, such as that shown in FIG. 3, which is not limited herein.

For example, in one specific example of the organic electroluminescent display device, each pixel unit comprises sub-pixel units for displaying three primary colors, that is, a sub-pixel unit for displaying red, a sub-pixel unit for displaying green and a sub-pixel unit for displaying blue. Of course, in one specific example, each pixel unit can also comprise sub-pixel units for displaying other colors, such as sub-pixel units for displaying red, blue, green, yellow or sub-pixel units for displaying red, blue, green and orange, which is not limited herein.

For example, in the organic electroluminescent display device provided in an embodiment of the present invention, each of the sub-pixel units in the pixel units emit monochromatic light corresponding to a color of the sub-pixel unit directly after being electrically excited, that is, each of the sub-pixel units in the organic electroluminescent display device comprises an organic electroluminescent structure for emitting monochromatic light corresponding to the color of the sub-pixel unit, which organic electroluminescent structure emits monochromatic light corresponding to the color of the sub-pixel unit directly without any color filter provided.

Alternatively, for example, in the organic electroluminescent display device provided in an embodiment of the present invention, the light emitted by each of the sub-pixel units in the pixel units after being electrically excited forms monochromatic light corresponding to a color of the sub-pixel unit, that is, an organic electroluminescent structure of each of the sub-pixel units in the organic electroluminescent display device emit white light which forms light corresponding to the color of the sub-pixel unit under the action of a color filter.

Based on the same inventive concept, another embodiment of the present invention further provides a display device comprising the above-mentioned organic electroluminescent display device provided in embodiments of the present invention. The display device can be a mobile telephone, a tablet computer, a television, a display, a notebook computer, a digital photo frame, a navigator and any other products and parts having the display function. The display device can be implemented with reference to the above mentioned embodiments of the organic electroluminescent display devices and repetitions will not be described any more herein.

Based on the same inventive concept, another embodiment of the present invention further provides a driving method of organic electroluminescent display device. The organic electroluminescent display device comprises: a plurality of pixel units arranged in matrix, wherein each of the pixel units comprises a plurality of sub-pixel units for displaying different colors, and in each row of the pixel units, two adjacent pixel units constitute a pixel unit group; and a sub-pixel unit for displaying white between two adjacent pixel units in each pixel unit group, wherein an area occupied by the sub-pixel unit for displaying white is greater than an area occupied by any one sub-pixel unit in the pixel units. The driving method comprises: alternatively replacing luminance of light emitted by one pixel unit of two adjacent pixel units in each pixel unit group with luminance of light emitted by the sub-pixel unit for displaying white between the two adjacent pixel units in odd numbered and even numbered frames.

For example, in one specific example of the driving method provided in an embodiment of the present invention, in an odd numbered frame, the luminance of light emitted by the sub-pixel unit for displaying white between two pixel units in each pixel unit group replaces the luminance of light emitted by the odd numbered pixel unit of the two adjacent pixel units; and in an even numbered frame, the luminance of light emitted by the sub-pixel unit for displaying white between two adjacent pixel units in each pixel unit group replaces the luminance of light emitted by the even numbered pixel unit of the two adjacent pixel units.

Alternatively, for example, in one specific example of the driving method provided in an embodiment of the present invention, in an odd numbered frame, the luminance of light emitted by the sub-pixel unit for displaying white between two pixel units in each pixel unit group replaces the luminance of light emitted by the even numbered pixel unit of the two adjacent pixel units; and in an even numbered frame, the luminance of light emitted by the sub-pixel unit for displaying white between two adjacent pixel units in each pixel unit group replaces the luminance of light emitted by the odd numbered pixel unit of the two adjacent pixel units.

Based on the same inventive concept, yet another embodiment of the present invention further provides a driving method of organic electroluminescent display device. The organic electroluminescent display device comprises: a plurality of pixel units arranged in matrix, wherein each of the pixel units comprises a plurality of sub-pixel units for displaying different colors, and in each row of the pixel units, two adjacent pixel units constitute a pixel unit group; and further comprises a sub-pixel unit for displaying white between two adjacent pixel units in each pixel unit group, wherein an area occupied by the sub-pixel unit for displaying white is greater than an area occupied by any one sub-pixel unit in the pixel units. The driving method comprises: replacing luminance of light emitted by one pixel unit with higher luminance of two adjacent pixel units in each pixel unit group with luminance of light emitted by the sub-pixel unit for displaying white between the two adjacent pixel units in a frame.

Furthermore, in one specific example of the driving method provided in an embodiment of the present invention, before replacing the luminance of light emitted by the pixel unit with higher luminance of the two adjacent pixel units with the luminance of light emitted by the sub-pixel unit for displaying white, the driving method further comprises: calculating respective luminance of two adjacent pixel units in each pixel unit group; determining the pixel unit with higher luminance of the two adjacent pixel units in each pixel unit group according to calculation results.

In the organic electroluminescent display device provided in embodiments of the present invention, since the sub-pixel unit for displaying white is between two adjacent pixel units in each pixel unit group and the sub-pixel unit for displaying white occupies a greater area than that occupied by any one sub-pixel unit in the pixel units, the aperture ratio of a single sub-pixel unit for displaying white is increased, thereby reducing the driving current required by the sub-pixel unit for displaying white, and in turn reducing the power consumption of the sub-pixel unit for displaying white, and finally increasing the overall lifetime of the organic electroluminescent display device. Furthermore, in the organic electroluminescent display device, the luminance of light emitted by the sub-pixel unit for displaying white between two adjacent pixel units in each pixel unit group replaces the luminance of light emitted by one pixel unit of the two adjacent pixel units in a frame according to a preset condition, therefore, the overall display luminance of the organic electroluminescent display device can be ensured while displaying.

Obviously, one skilled in the art can make various changes and variations to the present invention without departing from the spirit and scope of the present invention. Thus, if these changes and variations of the present invention fall within the scope of claims and equivalents of the present invention, it is intended that the present invention also include these changes and variations.

The present application claims benefits of a China patent application No. 201410023236.7 filed on Jan. 17, 2014, which is incorporated in its entirety herein by reference as part of the present application.

What is claimed is:

1. An organic electroluminescent display device comprising:
   a plurality of pixel units arranged in matrix, each of the pixel units comprising a plurality of sub-pixel units for displaying different colors, and in each row of the pixel units, two adjacent pixel units constituting a pixel unit group; and
   a sub-pixel unit for displaying white between two adjacent pixel units in each pixel unit group, wherein an area occupied by the sub-pixel unit for displaying white is greater than an area occupied by any one sub-pixel unit in the pixel units; the sub-pixel unit for displaying white is configured such that luminance of emitted light thereof replaces luminance of light emitted by one pixel unit of the two adjacent pixel units in a frame according to a preset condition, wherein the luminance of light emitted by the sub-pixel unit for displaying white replaces the luminance of light emitted by one pixel unit of the two adjacent pixel units alternatively in odd numbered frames and even numbered frames.

2. The organic electroluminescent display device of claim 1, wherein same areas are occupied by respective sub-pixel units in each pixel unit, and the area occupied by the sub-pixel unit for displaying white is equal to a sum of areas occupied by any two sub-pixel units in the pixel unit.

3. The organic electroluminescent display device of claim 2, wherein the plurality of sub-pixel units in each of the pixel units is arranged in a row direction of the pixel unit.

4. The organic electroluminescent display device of claim 3, wherein each of the pixel units comprises a sub-pixel unit for displaying red, a sub-pixel unit for displaying green and a sub-pixel unit for displaying blue.

5. The organic electroluminescent display device of claim 3, wherein each sub-pixel unit in the pixel unit directly emits monochromatic light corresponding to a color of the sub-pixel unit after being electrically excited; or the light emitted by each sub-pixel unit in the pixel unit after being electrically excited forms monochromatic light corresponding to the color of the sub-pixel unit after passing a color filter.

6. A display device comprising the organic electroluminescent display device of claim 1.

7. The organic electroluminescent display device of claim 1, wherein the plurality of sub-pixel units in each of the pixel units is arranged in a row direction of the pixel unit.

8. A driving method of an organic electroluminescent display device, wherein the organic electroluminescent display device comprises: a plurality of pixel units arranged in matrix, each of the pixel units comprising a plurality of sub-pixel units for displaying different colors, and in each row of the pixel units, two adjacent pixel units constituting a pixel unit group; and a sub-pixel unit for displaying white between two adjacent pixel units in each pixel unit group, an area occupied by the sub-pixel unit for displaying white being greater than an area occupied by any one sub-pixel unit in the pixel units;

the driving method comprising:

replacing luminance of light emitted by one pixel unit of the two adjacent pixel units with luminance of light emitted by the sub-pixel unit for displaying white alternatively in odd numbered and even numbered frames.

9. The driving method of the organic electroluminescent display device of claim 8, wherein same areas are occupied by respective sub-pixel units in each pixel unit, and the area occupied by the sub-pixel unit for displaying white is equal to a sum of areas occupied by any two sub-pixel units in the pixel unit.

10. The driving method of the organic electroluminescent display device of claim 9, wherein the plurality of sub-pixel units in each of the pixel units is arranged in a row direction of the pixel unit.

11. The driving method of the organic electroluminescent display device of claim 8, wherein the plurality of sub-pixel units in each of the pixel units is arranged in a row direction of the pixel unit.

* * * * *